(12) United States Patent
Delapierre

(10) Patent No.: US 7,745,891 B2
(45) Date of Patent: Jun. 29, 2010

(54) ENCAPSULATION COMPONENT FOR INTEGRATED MICRO ELECTROMECHANICAL SYSTEM COMPRISING FIRST AND SECOND COVERS

(75) Inventor: Gilles Delapierre, Seyssins (FR)

(73) Assignee: Commissariat a l'Energie Atomique, Paris (FR)

( * ) Notice: Subject to any disclaimer, the term of this patent is extended or adjusted under 35 U.S.C. 154(b) by 634 days.

(21) Appl. No.: 11/208,856

(22) Filed: Aug. 23, 2005

(65) Prior Publication Data

US 2006/0065941 A1 Mar. 30, 2006

(30) Foreign Application Priority Data

Sep. 28, 2004 (FR) .................................. 04 10232

(51) Int. Cl.
  *H01L 23/28* (2006.01)
(52) U.S. Cl. ................ 257/415; 257/787; 257/E23.128
(58) Field of Classification Search ................ 257/678, 257/E29.324, E23.125, 415–420, 100, 433, 257/434, 667, 787–796
See application file for complete search history.

(56) References Cited

U.S. PATENT DOCUMENTS 7,145,213 B1 * 12/2006 Ebel et al. .................... 257/414

FOREIGN PATENT DOCUMENTS

WO WO 01/58804 A2 8/2001
WO WO 03/070625 A2 8/2003

OTHER PUBLICATIONS

Aigner et al., "Cavity-Micromachining' Technology: Zero-Package Solution for Inertial Sensors," Transducers, Eurosensors XV, 11th International Conference on Solid-State Sensors and Actuators, Jun. 2001, pp. 186-189.
Stark et al., "A Low-Temperature Thin-Film Electroplated Metal Vacuum Package," Journal of Microelectromechanical Systems, vol. 13, No. 2, Apr. 2004, pp. 147-157.
Chen et al., Micro-Electro-Mechanical Systems (MEMS), ASME International Mechanical Engineering Congress and Exposition, vol. 3, Nov. 2001, pp. 769-774.
Bae et al., "Fabrication of cylinder type micro channel using photoresist reflow and isotropic etching," Microprocesses and Nanotechnology Conference, Digest of Papers, Oct. 2003, pp. 200-201.

* cited by examiner

*Primary Examiner*—Matthew C Landau
*Assistant Examiner*—Candice Y Chan
(74) *Attorney, Agent, or Firm*—Oliff & Berridge, PLC

(57) ABSTRACT

The microsystems are integrated in a first cavity bounded by at least a substrate and by a top wall formed by at least a part of a first cover. The component has a second cavity bounded by at least the whole of the top wall of the first cavity and by a second cover formed by a thin layer. The second cover can be covered by a coating made of plastic material molded from a casting. The fabrication process of the component comprises deposition, on the whole of the top wall of the first cavity, of a layer of polymer material and annealing of the layer of polymer material. The layer of polymer material acts as sacrificial layer for deposition of the thin layer designed to form the second cover.

11 Claims, 2 Drawing Sheets

ENCAPSULATION COMPONENT FOR INTEGRATED MICRO ELECTROMECHANICAL SYSTEM COMPRISING FIRST AND SECOND COVERS

BACKGROUND OF THE INVENTION

The invention relates to a component comprising micro electromechanical systems integrated in a first cavity bounded at least by a substrate and by a top wall formed by at least a part of a first cover.

STATE OF THE ART

The integrated micro electromechanical systems (MEMS) technology has undergone considerable development over the last few years. The best known applications are accelerometers for airbags, gyrometers for navigation and radiofrequency and optical switches for telecoms.

To reduce fabrication costs, it is sought to apply more and more extensively the principle of collective fabrication, on which the whole power of microtechnologies relies. Thus it is sought to fabricate the smallest chips possible so as to have as large a number of chips as possible on a single substrate.

Collective fabrication is all the more advantageous as it comprises all the fabrication steps. However, certain fabrication steps are performed collectively, whereas other steps are performed individually on each chip. The sealing step for example is very costly if it is performed on each individual chip after the latter have been cut out from the substrate.

A current MEMS is typically formed by a substrate and micro electromechanical systems integrated in a cavity. In order to protect the microsystems, a cover is fixed onto the substrate by sealing means designed to make the cavity hermetic.

It is sought to develop processes presenting the following features:
- collective on wafer,
- consuming little silicon surface (to reduce the size of the chips),
- ability to guarantee a very good long-lasting hermeticity in harsh temperature and humidity environments,
- generating little stray strain,
- preferably able to be performed at low temperature (<450° C.).

The components obtained by these processes must be able to withstand the subsequent packaging operations, in particular by coating with plastic material or overmolding.

None of the techniques known to date enables all these conditions to be met simultaneously.

A first known technique consists in sealing a cover by a bead made of polymer material. The advantage of this solution is that the shape of the bead can be defined by photolithography techniques which enable beads of very small width to be achieved (a few tens of micrometers), consuming little chip surface. Sealing can moreover be performed by simple means at low temperature. The components obtained by this technique can withstand the overmolding operation, but the major drawback is that, with a polymer, it is impossible to guarantee a very good hermeticity, notably to vacuum. Polymers do not moreover present a great resistance to aggressions from the environment.

A second technique, widely used nowadays, consists in using a molten glass bead deposited by silk screen process. Glasses melting at 450° C. can be found and this technique ensures a good hermeticity. The components obtained by this technique withstand the overmolding operation. It does however present the large drawback of leading to beads of very great width (a few hundred micrometers) which becomes unacceptable for large-scale distribution products. For example, the surface of the chips for an acceleration sensor of the next generation will be about one square millimeter. The width of the bead is however linked to the glass paste deposition technique by silk screen process and it is therefore difficult to hope to reduce this width.

A third, more integrated, technique consists in replacing the cover by a deposited thin film. Performing a process of this type typically involves deposition of a sacrificial layer, deposition of the thin film acting as cover and removal of the sacrificial layer. The cover layer is often made of polycrystalline silicon, a material sometimes also used for the MEMS itself. The cover is then covered with a plastic coating molded from a casting. This technique presents the advantage of a very large miniaturization and therefore a very low potential cost. It uses mineral sealing, which is therefore hermetic. A great drawback is however that the cover cannot withstand the high pressures of coating with a plastic coating molded from a casting, in particular when the surface of the cover is large.

A solution to overcome this problem consists in making the cover rest on a large number of small pillars which limit the sag of the thin film cover. However, this clutters up the device and greatly limits the freedom of design of the MEMS, for to withstand pressures of about 100 bars, the pillars have to be very close to one another, typically separated by a few tens of microns. Even with such small separating distances, the safety margins with respect to the breaking limit of the cover or pillars remain low. This is aggravated by the fact that the solid plastic used for molding from a casting exerts not only hydrostatic forces, but also shear forces on the cover when it solidifies, due to the difference of the heat expansion coefficients. A known method to improve the withstand to molding from a casting is to place a drop of viscous gel that absorbs the stresses on the chip, in particular the shear stresses when solidification takes place. This method is however not collective and is unsuitable for performing production in a clean room. Furthermore, the molding from a casting is often performed by another company than the one manufacturing the chip and transporting the chip with the gel already deposited also gives rise to problems of reliability and of defining responsibilities in the event of problems arising. Another solution can be to deposit the gel on the premises of the company performing the molding from a casting, but this would require a specific adaptation of the production tool.

OBJECT OF THE INVENTION

It is an object of the invention to remedy these shortcomings and more particularly to propose a collective integrated MEMS encapsulation process minimizing the problems of space occupation, heat expansion, solidity of the cover and manufacturing costs.

According to the invention, this object is achieved by the accompanying claims and more particularly by the fact that the component comprises a second cover formed by a thin layer, bounding a second cavity, at least with the whole of the top wall of the first cavity.

It is a further object of the invention to provide a fabrication process of a component according to the invention, the process successively comprising, after the micro electromechanical systems and the first cover have been achieved:
- deposition of a layer of polymer material on the whole of the top wall of the first cavity,
- annealing of the layer of polymer material, deposition of the thin layer designed to form the second cover on the layer of polymer material, etching of at least one orifice in the second cover, removal of the layer of polymer material by means of the orifice.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
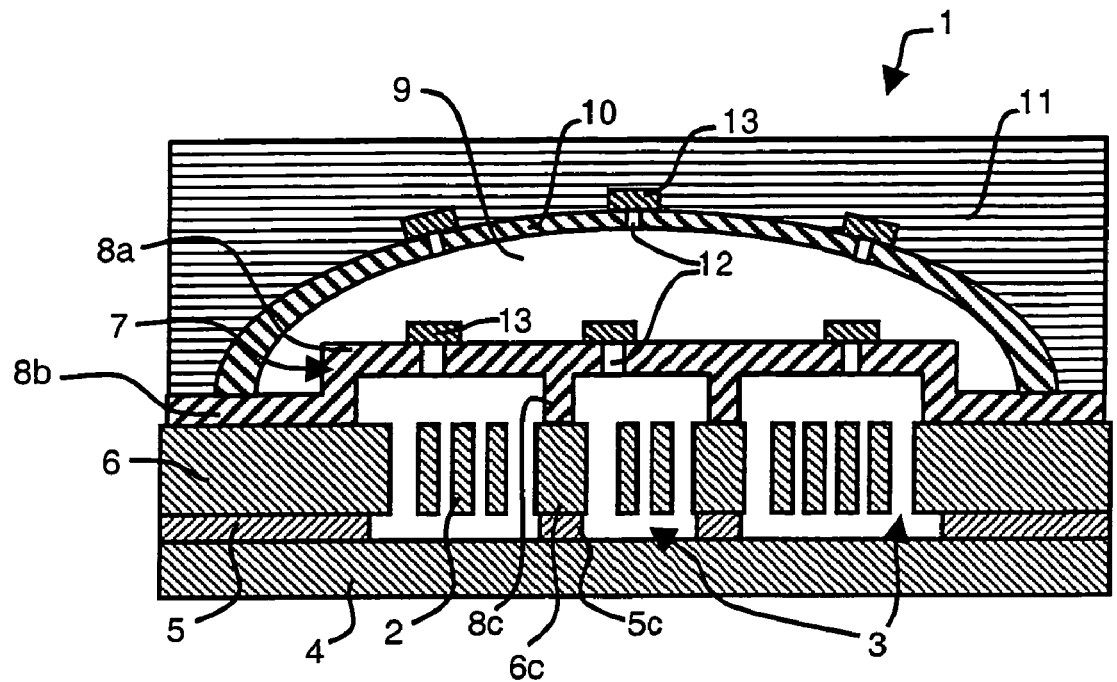
FIGS. 1 and 2 represent two particular embodiments of a component according to the invention, in cross-section.

FIG. 1 represents an encapsulation component 1 of micro electromechanical systems 2 integrated in a first cavity 3. The first cavity 3 is preferably tightly sealed. As represented in FIG. 1, the microsystems 2 can be constituted by suspended elements. In the particular embodiment represented in FIG. 1, the first cavity 3 is bounded by a supporting substrate 4, by the side faces of an insulating layer 5, by a microstructured substrate 6 wherein the microsystems 2 are machined, and by a top wall 7 of the first cavity 3, formed by a raised part 8a of a first cover 8. Bottom parts 8b of the first cover 8 arranged on each side of the raised part 8a rest on the microstructured substrate 6. In addition, as represented in FIG. 1, the raised part 8a can be placed on columns each formed by superposition of an intermediate bottom part 8c of the first cover 8, of an intermediate part 6c of the microstructured substrate 6 and by an intermediate part 5c of the insulating layer 5.

A second cavity 9 is bounded by the whole of the top wall 7 of the first cavity 3, by the bottom parts 8b of the first cover 8 and by a second cover 10 formed by a thin layer, and possibly by plugs 13 deposited on the second cover 10 and etched. The thin layer forming the second cover 10 is preferably convex. As represented in FIG. 1, the second cover 10 can be covered by a coating 11 of plastic material molded from a casting enabling the component to be protected.

In FIG. 1, the first cover 8 and second cover 10 comprise orifices 12 enabling removal of sacrificial layers used for fabrication of the covers, and of the plugs 13 closing off the orifices 12.

Figure 2:
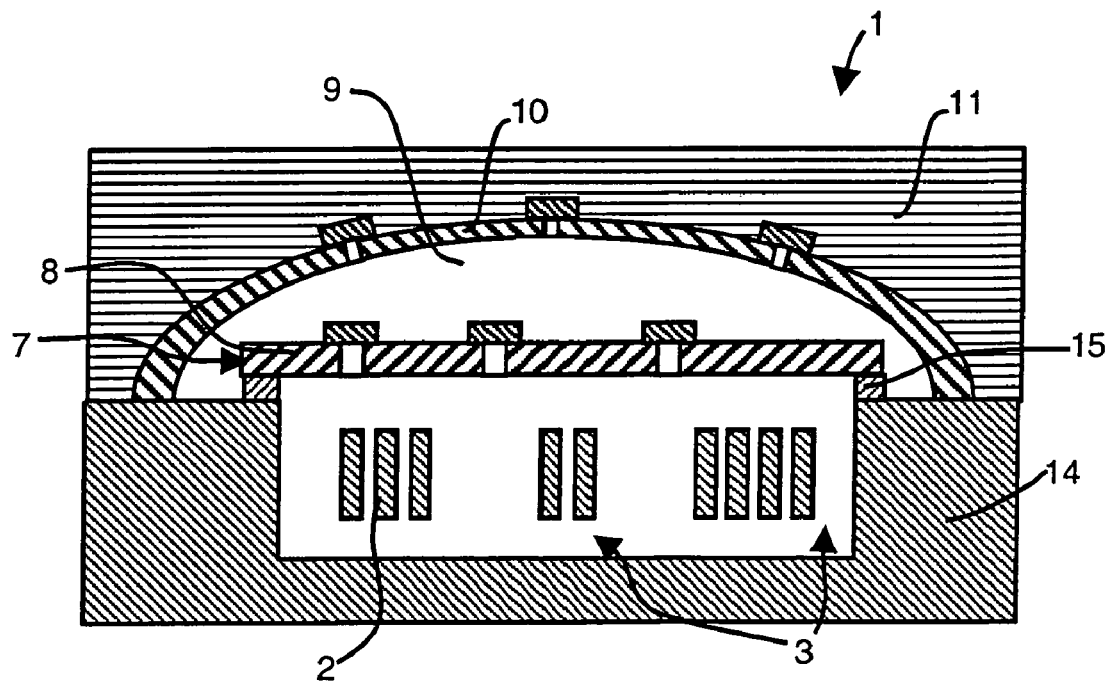

In FIG. 2, the first cavity 3 is bounded by a substrate 14, by a seal 15 and by the top wall 7 of the first cavity 3, formed by the whole of a flat first cover 8. The second cavity 9 is bounded by the whole of the top wall 7 of the first cavity 3, by side faces of the sealing layer 15, by a front face of the substrate 14 and by the second cover 10.

According to the invention, the whole of the top wall 7 of the first cavity 3 bounds the second cavity 9, i.e. the second cover 10 is not in contact with the top wall 7 of the first cavity 3. The second cover 10 is able to withstand shear forces and strong pressures, for example the pressures of the plastic material constituting the coating 11 of the component 1.

The second cover 10 is very solid when it has a convex shape. The second cover 10 then forms a protective dome arranged above the first cover 8, without coming into contact with the top wall 7 of the cavity 3. For example in FIG. 1, the second cover 10 is in fact placed on the bottom parts 8b of the first cover 8 arranged on each side of the raised part 8a of the first cover 8. In the particular embodiment represented in FIG. 2, the second cover 10 is placed on the substrate 14. Thus, in both cases, no shear force is exerted on the top wall 7 by the coating 11.

The micro electromechanical systems 2 and the first cover 8 can be achieved in known manner, for example as described in the document "Cavity-Micromachining Technology: Zero-Package Solution for Inertial Sensors" by R. Aigner et Al. (Transducers '01 Eurosensor XV, 11$^{th}$ International Conference on Solid-State Sensors and Actuators, Munich, Germany, Jun. 10-14, 2001). Thus, a layer of polycrystalline or monocrystalline silicon is fabricated, by epitaxy type deposition or by molecular bonding, on the insulating layer 5 which is for example made of silica. Said silicon layer is etched, for example by anisotropic reactive ionic etching, to obtain the microstructured substrate 6.

Figure 3:
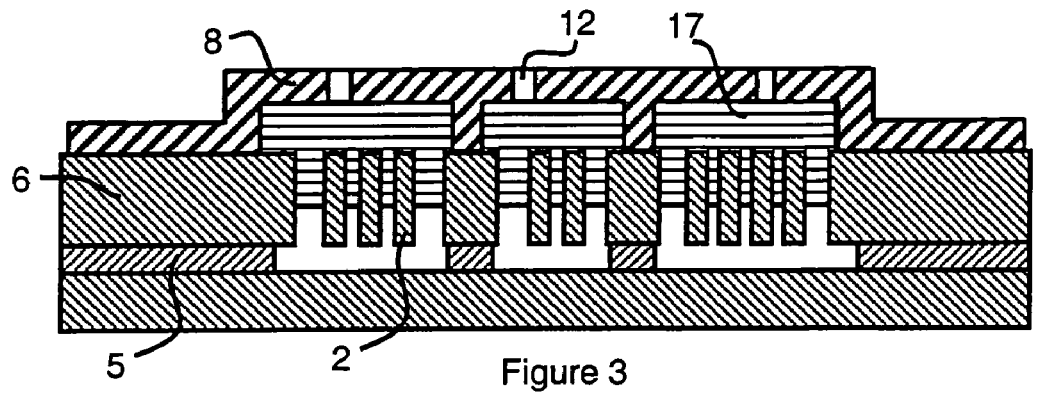
FIGS. 3 to 5 illustrate a particular embodiment of a fabrication process according to the invention, in cross-section.

Then, as represented in FIG. 3, a first sacrificial layer 17 is deposited on the micro electromechanical systems 2 and on the microstructured substrate 6. The first sacrificial layer 17 is for example formed by an insulating layer achieved by chemical vapor deposition and etched to define the shape of the first cover 8 and of the first cavity 3. The thickness of the first sacrificial layer 17 is generally not more than a few micrometers. On the one hand, the deposition techniques conventionally used do not in fact enable a thickness of more than a few micrometers to be achieved, and, on the other hand, the etching time for removal of the sacrificial layer must not be too long. Thus, the first cover 8 automatically has a flat shape, which limits its pressure resistance.

Figure 4:
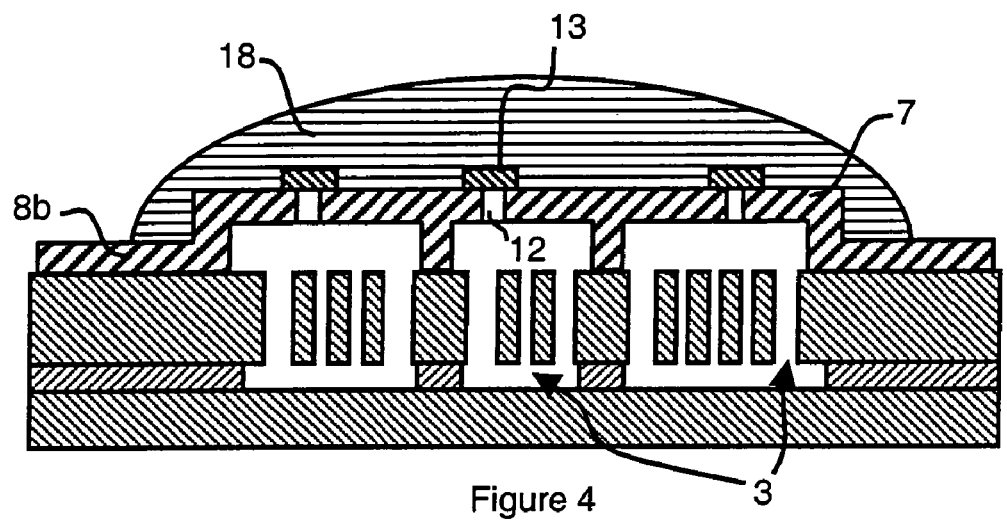

The first cover 8 is then achieved by deposition of a thin layer, for example of polycrystalline silicon, on the first sacrificial layer 17 and on the substrate 6. The orifices 12 are then etched in the first cover 8 and the first sacrificial layer 17 is removed, for example by chemical etching using a hydrofluoric acid based bath, so as to form the first cavity 3, as represented in FIG. 4. After the first sacrificial layer 17 has been removed, the orifices 12 of the first cover 8 are blanked off by means of plugs 13, fabricated for example by chemical vapor deposition or by fusible glass serigraphy.

The second cover 10 is preferably achieved by means of another technique than that used for the first cover 8, in order to obtain a convex shape of the second cover 10, more solid to be able to withstand high pressures and shear forces. For this, a layer of polymer material 18 constituting a second sacrificial layer is deposited on the whole of the top wall 7 of the first cavity 3 and on the bottom parts 8b of the first cover 8. The layer of polymer material 18 is for example achieved by deposition by whirler and by etching enabling the layer of polymer material 18 to be bounded laterally. The layer of polymer material 18 is then annealed, which enables a convex surface of the layer of polymer material 18 to be obtained, in particular by creep and by the effect of the internal stresses. In FIG. 4, for example, the layer of polymer material 18 is convex, after annealing.

Figure 5:
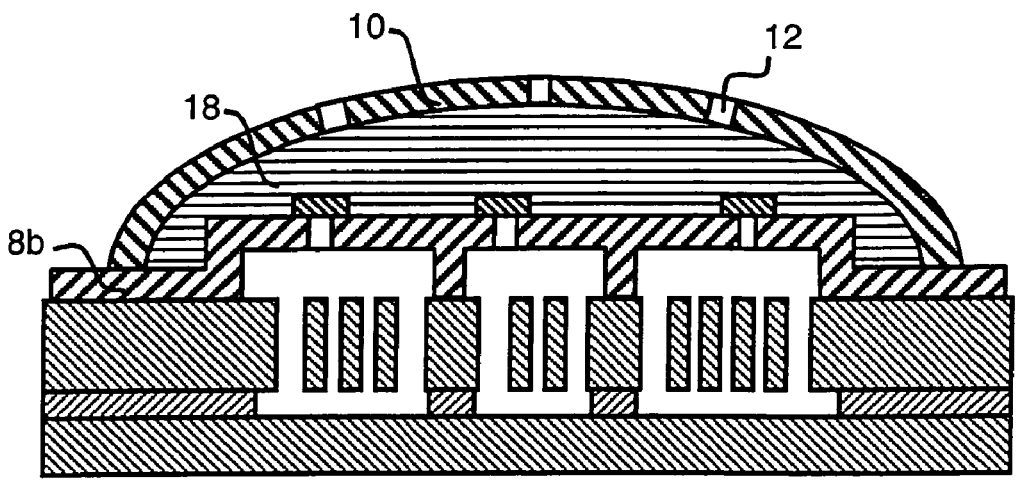

As represented in FIG. 5, a thin layer, designed to form the second cover 10, is deposited on the bottom parts 8b and on the layer of polymer material 18 and automatically takes a convex shape. The convex thin layer is preferably obtained by chemical vapor deposition of silicon nitride or of a metal and etched laterally to give it the shape of the second cover 10. As represented in FIG. 5, orifices 12 are etched in the second cover 10. The second sacrificial layer 18 is removed by means of the orifices 12, so as to empty the second cavity 9, for example by oxygen plasma etching (FIG. 1).

Then a sealing layer can be deposited on the locations of the orifices 12 of the second cover 10 so as to form plugs 13 closing off the orifices 12 of the second cover 10.

At the end of the process, the coating 11 of plastic material can be molded from a casting, in known manner, onto the second cover 10.

Deposition of the sealing layer can be performed for example by chemical vapor deposition or by evaporation or even more simply by deposition of a layer of polymer material, for example a resin layer. It is not necessarily indispensable to have a good tightness of the second cavity 9, when the latter is covered by the coating 11 of plastic material molded from a casting. It is thus sufficient to ensure the tightness of the second cavity 9 temporarily until the coating 11 is over molded on the second cover 10, as represented in FIG. 1. As the plastic of the coating 11 generally has a high viscosity, it is even possible, in certain cases, not to fill in the orifices 12 of the second cover 10, without the plastic entering the orifices 12. The hydrostatic pressure is then partly transmitted to the first cover 8 by the gases that may be contained in the second cavity 9, but the shear forces exerted on the first cover of a component according to the prior art are eliminated, which can be sufficient to preserve the integrity of the first cover 8.

The invention claimed is:

1. A component comprising:
    micro electromechanical systems integrated in a first cavity bounded at least by a substrate and by a top wall, formed by at least a part of a first cover, the first cavity being sealed, and
    a second cover, formed by a thin layer, bounding a second cavity, at least with the whole of the top wall of the first cavity, wherein
    the first cavity is physically separated from the second cavity.

2. The component according to claim 1, wherein the second cover comprises at least one orifice.

3. The component according to claim 2, comprising a plug closing off the orifice.

4. The component according to claim 1, wherein the thin layer forming the second cover is convex.

5. The component according to claim 1, wherein the component comprises a coating.

6. The component according to claim 5, wherein the second cover is covered by the coating.

7. The component according to claim 6, wherein the coating is made of plastic material molded from a casting.

8. A fabrication process of a component according to claim 2, successively comprising, after the micro electromechanical systems and the first cover have been achieved:
    deposition of a layer of polymer material on the whole of the top wall of the first cavity,
    annealing of the layer of polymer material,
    deposition of the thin layer designed to form the second cover on the layer of polymer material,
    etching of at least one orifice in the second cover,
    removal of the layer of polymer material by means of the orifice.

9. The process according to claim 8, comprising deposition of a sealing layer forming a plug closing off the orifice of the second cover, after the layer of polymer material has been removed.

10. The process according to claim 9, wherein the sealing layer of the orifice is constituted by a resin.

11. The process according to claim 8, comprising fabrication of a coating of plastic material molded from a casting at the end of the process.

* * * * *